(12) United States Patent
Froese et al.

(10) Patent No.: US 10,645,808 B2
(45) Date of Patent: May 5, 2020

(54) DEVICES WITH RADIO-FREQUENCY PRINTED CIRCUITS

(71) Applicant: Apple Inc., Cupertino, CA (US)

(72) Inventors: Kevin M. Froese, San Francisco, CA (US); Qian Zhang, La Jolla, CA (US); Paul Choiniere, Livermore, CA (US); Derek C. Krass, Santa Cruz, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/212,453

(22) Filed: Dec. 6, 2018

(65) Prior Publication Data

US 2019/0261509 A1    Aug. 22, 2019

Related U.S. Application Data

(60) Provisional application No. 62/633,734, filed on Feb. 22, 2018.

(51) Int. Cl.
| | |
|---|---|
| *H05K 1/00* | (2006.01) |
| *H05K 1/02* | (2006.01) |
| *H05K 1/03* | (2006.01) |
| *H05K 1/05* | (2006.01) |
| *H05K 1/09* | (2006.01) |
| *H05K 1/11* | (2006.01) |

(Continued)

(52) U.S. Cl.
CPC ......... *H05K 1/0393* (2013.01); *H01Q 9/0421* (2013.01); *H05K 1/024* (2013.01); *H05K 1/0353* (2013.01); *H05K 1/189* (2013.01); *H05K 2201/10098* (2013.01)

(58) Field of Classification Search
CPC .. H05K 1/00; H05K 1/02; H05K 1/03; H05K 1/05; H05K 1/09; H05K 1/11; H05K 1/16; H05K 3/00; H05K 3/10; H05K 3/20; H05K 3/46
USPC ............... 174/254, 250, 255, 257, 258, 262; 428/131, 209, 215, 220, 323, 480, 620; 361/313, 761, 792; 257/701, 787; 29/600, 830, 831, 832, 840, 852
See application file for complete search history.

(56) References Cited

U.S. PATENT DOCUMENTS 4,751,146 A * 6/1988 Maeda ................. H05K 1/0326
    428/209
4,769,270 A * 9/1988 Nagamatsu ............ H05K 1/056
    174/255

(Continued)

*Primary Examiner* — Xiaoliang Chen
(74) *Attorney, Agent, or Firm* — Treyz Law Group, P.C.; G. Victor Treyz; Matthew R. Williams

(57) ABSTRACT

Dielectric such as polyether ether ketone may be used in forming radio-frequency flexible printed circuits. Filler may be incorporated into the dielectric to adjust the coefficient of thermal expansion of the flexible printed circuit. One or more layers of the flexible printed circuit may be unfilled and one or more layers of the flexible printed circuit may be filled. Antennas may be formed from metal traces on the flexible printed circuit, metal electronic device housing structures, or other conductive structures. A transmission line on the flexible printed circuit may couple radio-frequency transceiver circuitry in an electronic device to an antenna. A flexible printed circuit may have a portion with enhanced bendability in a location that overlaps a bend region. The enhanced bendability region may have less filler than other portions of the flexible printed circuit.

14 Claims, 8 Drawing Sheets

(51) Int. Cl.
  *H05K 1/16* (2006.01)
  *H05K 3/00* (2006.01)
  *H05K 3/10* (2006.01)
  *H05K 3/20* (2006.01)
  *H05K 3/46* (2006.01)
  *H05K 1/18* (2006.01)
  *H01Q 9/04* (2006.01)

(56) References Cited

U.S. PATENT DOCUMENTS

| | | | | |
|---|---|---|---|---|
| 4,992,323 | A * | 2/1991 | Vogelesang | B32B 15/08 428/215 |
| 5,115,077 | A * | 5/1992 | Matsuo | C08G 65/4031 528/125 |
| 5,597,631 | A * | 1/1997 | Furumoto | B29C 70/086 428/36.4 |
| 5,672,414 | A * | 9/1997 | Okamoto | H01L 23/24 428/209 |
| 5,707,749 | A * | 1/1998 | Katagiri | B32B 15/08 428/473.5 |
| 5,804,791 | A * | 9/1998 | Gelus | D06F 75/24 219/245 |
| 5,814,894 | A * | 9/1998 | Igarashi | H01L 21/563 257/778 |
| 6,051,448 | A * | 4/2000 | Hayama | H01F 41/043 438/108 |
| 6,184,577 | B1 * | 2/2001 | Takemura | H01L 21/563 257/701 |
| 6,443,179 | B1 * | 9/2002 | Benavides | F15C 5/00 137/454.2 |
| 7,188,412 | B2 * | 3/2007 | Yazaki | H05K 3/4069 29/830 |
| 2003/0133275 | A1 * | 7/2003 | Miyake | H05K 1/162 361/761 |
| 2006/0044735 | A1 * | 3/2006 | Hayashi | H01L 23/49816 361/313 |
| 2008/0171255 | A1 * | 7/2008 | Brantley | H01M 8/0273 429/480 |
| 2008/0254313 | A1 * | 10/2008 | Kennedy | H05K 3/4626 428/620 |
| 2009/0001980 | A1 * | 1/2009 | Geren | B82Y 25/00 324/252 |
| 2011/0165403 | A1 * | 7/2011 | Lefebure | B29C 70/025 428/220 |
| 2012/0015176 | A1 * | 1/2012 | Riebel | B32B 27/06 428/323 |
| 2012/0203317 | A1 * | 8/2012 | Valentine | A61N 1/375 607/116 |
| 2016/0020165 | A1 * | 1/2016 | Kamgaing | H01L 21/288 361/679.55 |
| 2016/0174364 | A1 * | 6/2016 | Harkness, Jr. | H05K 1/111 174/257 |
| 2017/0177108 | A1 * | 6/2017 | Sebastian | G06F 3/044 |
| 2018/0218836 | A1 * | 8/2018 | Kim | H01F 41/14 |

* cited by examiner

DEVICES WITH RADIO-FREQUENCY PRINTED CIRCUITS

This application claims priority to U.S. provisional patent application No. 62/633,734 filed on Feb. 22, 2018, which is hereby incorporated by reference herein in its entirety.

FIELD

This relates to radio-frequency circuitry and, more particularly, to flexible printed circuits and devices with radio-frequency circuitry.

BACKGROUND

Electronic devices may be provided with wireless communications capabilities. To handle wireless communications, electronic devices include communications circuitry. The communications circuitry may include antennas, transmission lines, and transceiver circuitry operating at radio frequencies. Radio-frequency circuits may be formed on substrates such as flexible printed circuits.

Challenges can arise in forming radio-frequency circuitry on flexible printed circuits. For example, some flexible printed circuit materials such as extruded liquid crystal polymers that exhibit desirable radio-frequency properties such as low dielectric constant and low loss tangent values may be fragile. If care is not taken, the use of these flexible printed circuit materials may make a radio-frequency circuit susceptible to damage, potentially reducing device reliability and lowering manufacturing yields.

SUMMARY

Radio-frequency flexible printed circuits for electronic devices with antennas may be formed from a dielectric such as polyether ether ketone. The dielectric may include multiple layers laminated together without interposed adhesive bonding layers. Metal traces for forming digital signal lines, antenna traces, transmission lines, and other circuitry may be formed on one or more of the layers of dielectric.

Filler such as mineral filler may be incorporated into the dielectric to help match the coefficient of thermal expansion of the flexible printed circuit to the coefficient of thermal expansion of copper or other metal used in forming the metal traces. In some configurations, one or more layers of the flexible printed circuit may be unfilled and one or more laminated layers of the flexible printed circuit may be filled. The filler may be fabric filler, filler formed from particles, or other filler.

Antennas may be formed from metal traces on the flexible printed circuit, metal electronic device housing structures, or other conductive structures. A transmission line on the flexible printed circuit may couple radio-frequency transceiver circuitry in an electronic device to an antenna.

A flexible printed circuit have a bend region in which the flexible printed circuit is bent. If desired, the flexible printed circuit may have a portion with enhanced bendability in a location that overlaps the bend region. The enhanced bendability region may have less filler than other portions of the flexible printed circuit.

DETAILED DESCRIPTION

Figure 1:
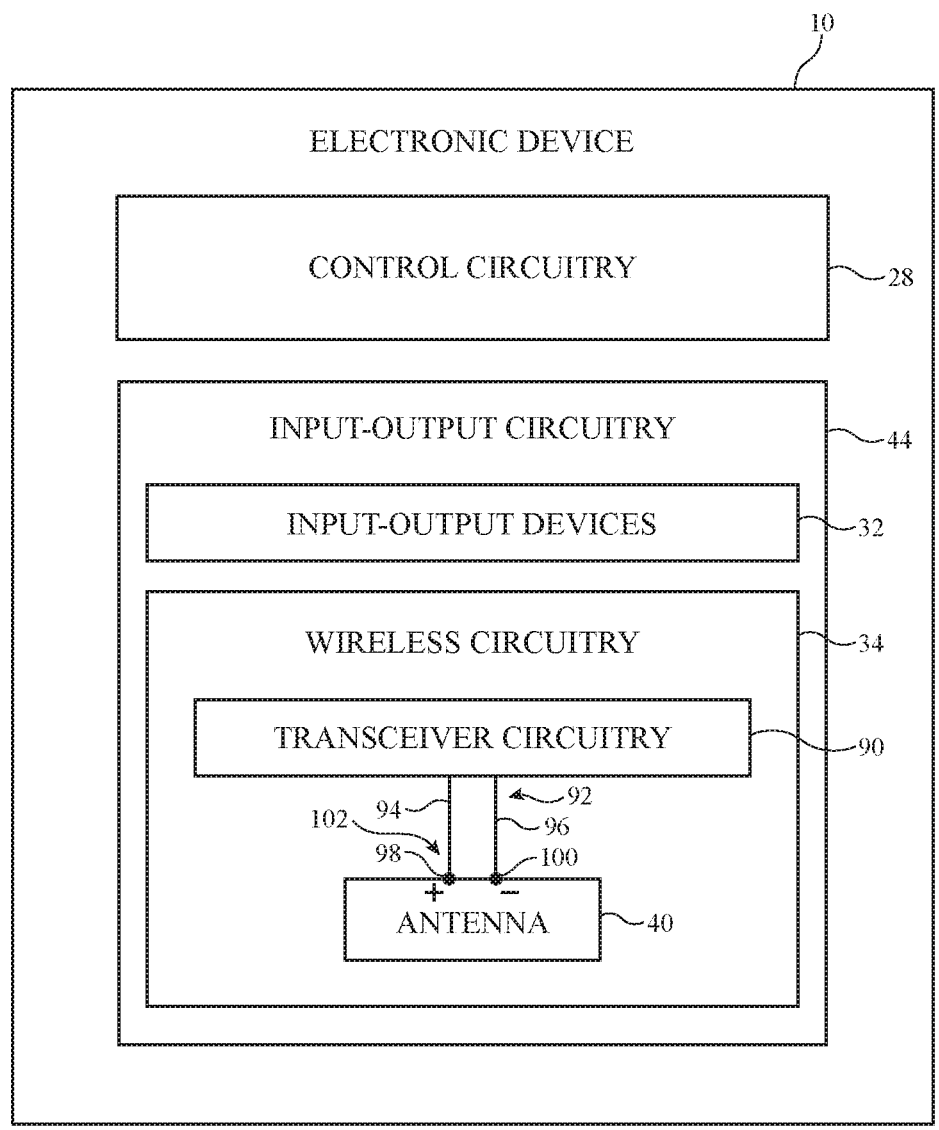
FIG. 1 is a schematic diagram of an illustrative electronic device in accordance with an embodiment.

Radio-frequency circuitry such as antennas, transmission lines, and other antenna circuitry can be formed on flexible printed circuits. The flexible printed circuits may be formed from dielectric material with electrical properties suitable for handing radio-frequency signals (e.g., dielectric with low values of dielectric constant dk and loss tangent df) while also exhibiting satisfactory mechanical properties (e.g., sufficient robustness to ensure satisfactory manufacturing yields and high reliability). The flexible printed circuits may, as an example, be formed from a material such as polyether ether ketone (PEEK).

Polyether ether ketone is a thermoplastic polymer that can be formed into flexible sheets (e.g., by extrusion). The sheets can be laminated together using heat and pressure at a temperature just below the melting temperature (343° C.) of polyether ether ketone (e.g., a temperature of about 280-320° C.). This approach allows multilayer flexible printed circuits to be formed without using intermediate adhesive bonding layers, thereby minimizing the thickness of the flexible printed circuits. The resulting flexible printed circuits are able to withstand solder reflow temperatures (e.g., reflow temperatures of 260° C.) and may exhibit satisfactory mechanical properties. For example, unfilled PEEK may exhibit superior ductility to printed circuit materials such as liquid crystal polymer.

If desired, filler may be incorporated into one or more dielectric layers in a flexible printed circuit to help match the coefficient of thermal expansion of the flexible printed circuit dielectric material to that of the copper traces forming antenna circuitry on the flexible printed circuit. Filler may, as an example, be added so that the coefficient of thermal expansion of the dielectric matches the coefficient of thermal expansion of copper (or other metal) within a desired amount (e.g., within 20%, within 15%, within 5%, or other suitable value).

Flexible printed circuits formed from materials such as PEEK may be used as substrates for radio-frequency circuitry and other circuitry in any suitable electronic system. As an example, these flexible printed circuits may be used in an electronic device such as electronic device 10 of FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, equipment that implements the functionality of two or more of these devices, or other electronic equipment.

As shown in FIG. 1, device 10 may include storage and processing circuitry such as control circuitry 28. Circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in circuitry 28 may be used to control the operation of device 10. This processing circuitry may be based on one or more microprocessors, microcontrollers, digital signal processors, application specific integrated circuits, etc.

Circuitry 28 may be used to run software on device 10, such as application programs and operating system code. To support interactions with external equipment, circuitry 28 may be used in implementing communications protocols. Communications protocols that may be implemented using circuitry 28 include internet protocols, wireless local area network protocols (e.g., IEEE 802.11 protocols—sometimes referred to as WiFi®—and protocols for other short-range wireless communications links such as the Bluetooth® protocol), cellular telephone protocols, antenna diversity protocols, etc.

Device 10 may include input-output circuitry 44. Input-output circuitry 44 may include input-output devices 32. Input-output devices 32 may include user interface devices, data port devices, touch sensors and other sensors, buttons, and other input-output components for gathering information from a user and the environment surrounding device 10. Input-output devices 32 may also include light-emitting components such as displays and status indicator lights, speakers, vibrators, and other output components.

Input-output circuitry 44 may include wireless circuitry 34 to support wireless communications. Wireless circuitry 34 may include radio-frequency (RF) transceiver circuitry 90 formed from one or more integrated circuits, power amplifier circuitry, low-noise input amplifiers, passive RF components, one or more antennas such as antenna 40, transmission lines such as transmission line 92, and other circuitry for handling RF wireless signals.

Radio-frequency transceiver circuitry 90 may include wireless local area network transceiver circuitry to handle 2.4 GHz and 5 GHz bands for WiFi® (IEEE 802.11) communications and may include Bluetooth® circuitry to handle the 2.4 GHz Bluetooth® communications band. If desired, circuitry 90 may handle other bands such as cellular telephone bands (e.g., bands from 700 MHz to 2700 MHz and/or bands covering frequencies below 700 MHz and/or above 2700 MHz), near-field communications bands (e.g., 13.56 MHz), millimeter wave bands (e.g., communications at 60 GHz), and/or other communications bands.

Wireless circuitry 34 may include one or more antennas such as antenna 40. Antennas such as antenna 40 may be formed using any suitable antenna types. For example, antennas in device 10 may include antennas with resonating elements that are formed from loop antenna structures, patch antenna structures, inverted-F antenna structures, slot antenna structures, planar inverted-F antenna structures, helical antenna structures, monopole antennas, dipoles, hybrids of these designs, etc. Parasitic elements may be included in antennas 40 to adjust antenna performance. In some configurations, device 10 may have isolation elements between respective antennas 40. Different types of antennas may be used for different bands and combinations of bands. For example, one type of antenna may be used in forming a local wireless link antenna and another type of antenna may be used in forming a remote wireless link antenna. In some configurations, different antennas may be used in handling different bands for transceiver circuitry 90. Each antenna 40 may cover one or more bands. For example, antennas 40 may be dual band wireless local area network antennas.

As shown in FIG. 1, radio-frequency transceiver circuitry 90 may be coupled to antenna feed 102 of antenna 40 using transmission line 92. Antenna feed 102 may include a positive antenna feed terminal such as positive antenna feed terminal 98 and may have a ground antenna feed terminal such as ground antenna feed terminal 100. Transmission line 92 may be formed from metal traces on a printed circuit or other conductive structures and may have a positive transmission line signal path such as path 94 that is coupled to terminal 98 and a ground transmission line signal path such as path 96 that is coupled to terminal 100. Transmission line paths such as path 92 may be used to route antenna signals within device 10. Transmission lines in device 10 may include coaxial cable paths, microstrip transmission lines, stripline transmission lines, edge-coupled microstrip transmission lines, edge-coupled stripline transmission lines, transmission lines formed from combinations of transmission lines of these types, etc. Filter circuitry, switching circuitry, impedance matching circuitry, and other circuitry may be interposed within transmission lines such as transmission line 92 and/or circuits such as these may be incorporated into antenna 40 (e.g., to support antenna tuning, to support operation in desired frequency bands, etc.). During operation, control circuitry 28 may use transceiver circuitry 90 and antenna(s) 40 to transmit and receive data wirelessly. Control circuitry 28 may, for example, receive streaming media wirelessly using transceiver circuitry 90 and antenna (s) 40 and may play the media through a speaker in device 10.

Figure 2:
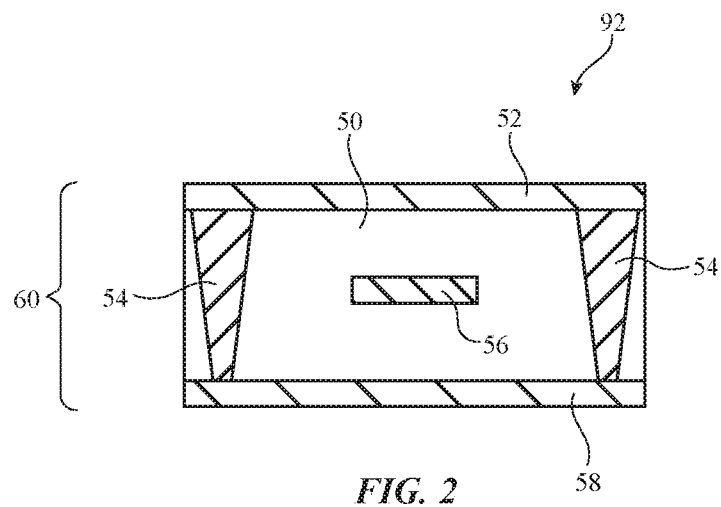
FIG. 2 is a cross-sectional side view of an illustrative flexible printed circuit that includes radio-frequency circuitry such as a radio-frequency transmission line in accordance with an embodiment.

FIG. 2 is a cross-sectional side view of an illustrative flexible printed circuit. Flexible printed circuit 60 has a substrate formed from one or more layers of polyether ether ketone or other dielectric 50. Metal traces (e.g., traces formed from copper or other metals) are formed on the substrate. Radio-frequency circuitry such as transmission line 92 may be formed on flexible printed circuit 60. As shown in FIG. 2, transmission line 92 may be formed from metal traces such as upper metal trace 52, lower metal trace

58, vias 54 (e.g., metal filled vias formed by laser drilling or mechanical drilling, metal deposition techniques such as electrochemical deposition, and/or other suitable via formation techniques), and central metal trace 56. Traces 52 and 58 may form ground plane traces for a transmission line ground path such a ground path 96 of FIG. 1 and vias 54 may short traces 52 and 58 together. Trace 56 may form a positive signal trace such as positive transmission line path 94 of FIG. 1. Other types of transmission line may be formed using metal traces on dielectric 50. Digital signal lines and/or other signal lines may also be optionally incorporated into flexible printed circuit 60. The example of FIG. 2 is illustrative.

Figure 3:
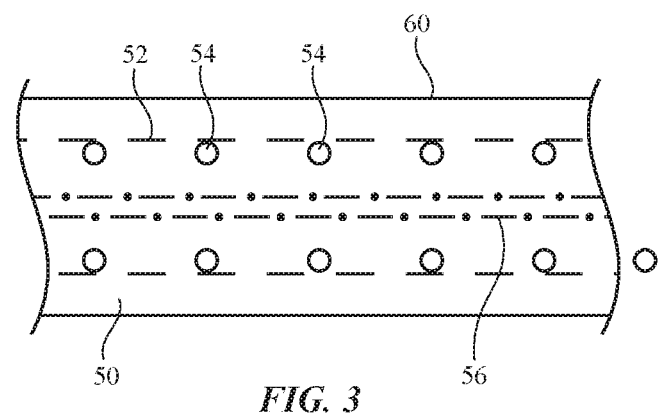
FIG. 3 is a top view of the illustrative flexible printed circuit of FIG. 2 in accordance with an embodiment.

FIG. 3 is a top view of flexible printed circuit 60 of FIG. 2 showing how vias 54 may be arranged along the edges of traces 52 (e.g., spaced with a pitch of at least 0.1 microns, at least 1 micron, at least 10 microns, at least 100 microns, at least 1000 microns, less than 10,000 microns, or other suitable spacing). In some configurations, dielectric 50 may include filler such as fiber filler (e.g., glass fabric). The filler may be configured so that openings in the filler overlap respective locations for forming vias 54 and/or laser drilling, mechanical drilling, or other via drilling techniques may be used to form openings through the filler.

Figure 4:
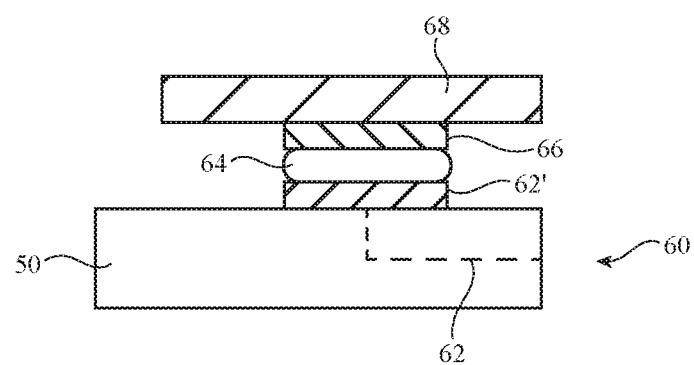
FIG. 4 is a cross-sectional side view of an illustrative flexible printed circuit coupled to circuitry using solder in accordance with an embodiment.

FIG. 4 is a cross-sectional side view of an illustrative flexible printed circuit coupled to additional circuitry 68. Additional circuitry 68 may be a printed circuit (e.g., a flexible printed circuit formed from a flexible polymer sheet or other flexible layer of dielectric or a rigid printed circuit formed from fiberglass-filled epoxy or other rigid printed circuit substrate material) or may be an electrical component (e.g., an integrated circuit or other electrical device). Circuitry 68 may have metal traces that form contacts such as contact 66. Contacts such as contact 66 may be electrically coupled to mating contacts such as contact 62' in metal traces 62 of flexible printed circuit 60. Electrical connections between contacts may be formed using solder 64 or other conductive connection arrangements (e.g., welds, conductive adhesive, etc.). Connections between flexible printed circuit 60 and additional circuitry 68 may be used to interconnect antennas and radio-frequency transceiver circuitry, transmission lines, filter circuits, impedance mating circuits, tunable antenna components, and other radio-frequency circuitry in device 10.

Figure 5:
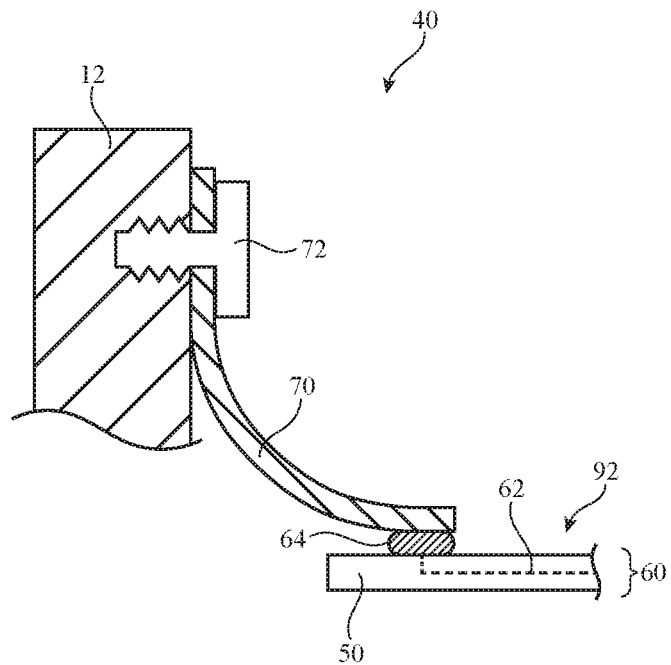
FIG. 5 is a cross-sectional side view of an illustrative antenna formed from a portion of a housing structure in an electronic device and coupled to a flexible printed circuit in accordance with an embodiment.

FIG. 5 is a cross-sectional side view of an illustrative antenna 40 to which transmission line 92 is being coupled. As shown in FIG. 5, printed circuit 60 may have metal traces 62 for transmission line 92 in dielectric substrate 50. A conductive structure such as metal member 70 may be electrically and mechanically coupled to conductive structure 12 using screw 72. Solder 64 or other conductive material may be used in coupling metal member 70 to metal traces 62. Metal traces 62 can form a transmission line path (e.g., path 94). Conductive structure 12 may be a metal housing structure or other conductive structure in device 10. Housing structures in device 10 may include metal (e.g., stainless steel, aluminum, etc.) and may, if desired, include other materials such as plastic, glass, ceramics, fiber composites, fabric, other suitable materials, or a combination of any two or more of these materials. In some arrangements, conductive structures 12 may form part of a metal unibody electronic device housing in which some or all of the housing is machined or molded as a single structure. In other arrangements, conductive structure 12 may form part of a metal housing frame (e.g., an internal frame structure for an electronic device housing that is formed using a frame with a covering of plastic, fabric, or other material). Cellular telephones, tablet computers, laptop computers, watches, and other electronic devices may have metal sidewalls and housing wall structures such as these may for portions of conductive structure 12. If desired, device 10 may also have a configuration in which conductive structure 12 does not form part of an electronic device housing and/or a configuration in which other antenna feed arrangements are used (e.g., arrangements without metal member 70). The configuration for antenna 40 of FIG. 5 is illustrative.

Figure 6:
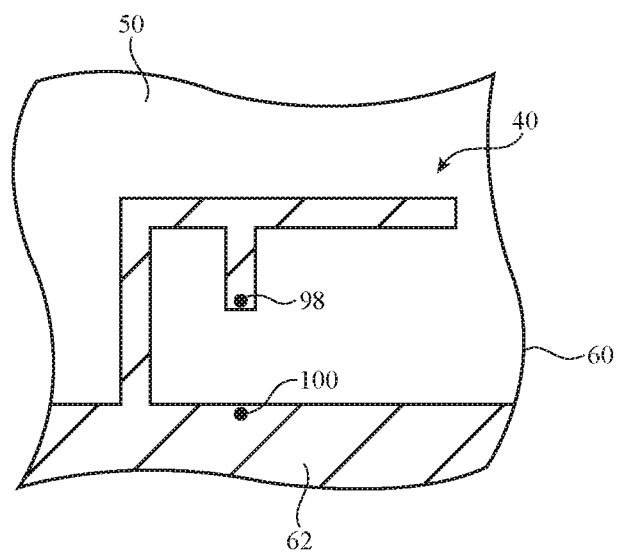
FIG. 6 is a top view of an illustrative flexible printed circuit with antenna traces in accordance with an embodiment.

FIG. 6 is a top view of flexible printed circuit 60 in an illustrative configuration in which metal traces 62 on dielectric 50 of flexible printed circuit 60 are used in forming antenna 40. Metal traces 62 may form an antenna resonating element such as an inverted-F antenna resonating element or other antenna resonating element, a parasitic antenna resonating element, ground plane structures for antenna 40, or other antenna circuitry. In the example of FIG. 6, antenna 40 is an inverted-F antenna feed using positive antenna feed terminal 98 and ground antenna feed terminal 100. Other antenna configurations may be used, if desired. In some arrangements, transmission line 92 and antenna 40 may be formed on separate substrates. In other arrangements, transmission line 92 and antenna 40 may be formed on a common substrate.

Figure 7:
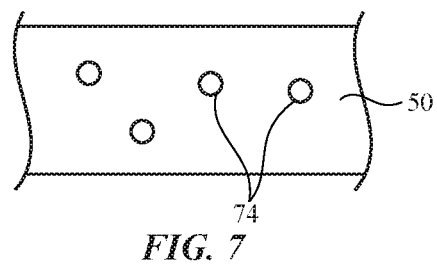
FIG. 7 is a cross-sectional side view of an illustrative flexible printed circuit layer with filler in accordance with an embodiment.
Figure 8:
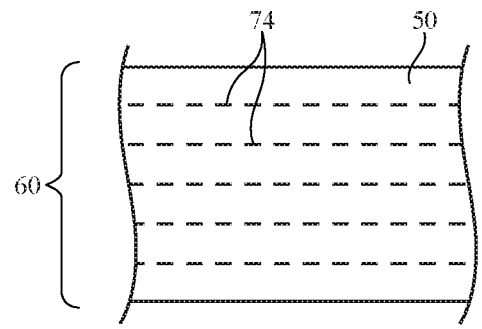
FIGS. 8, 9, and 10 are top views of illustrative flexible printed circuits with fiber filler in accordance with embodiments.
Figure 9:
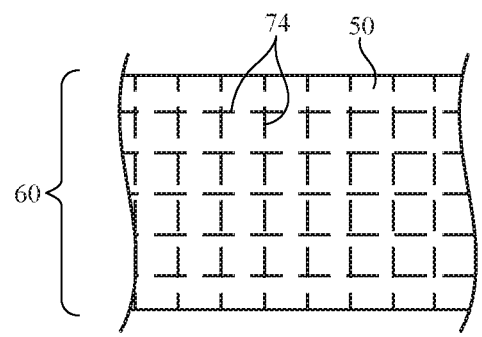
Figure 10:
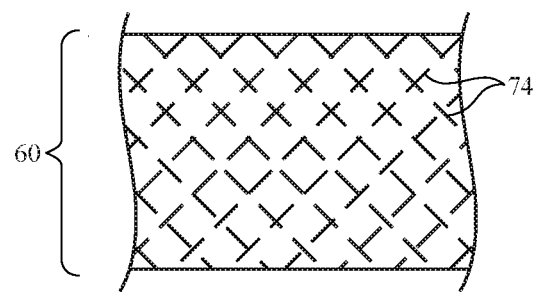

It may be desirable to alter the properties of dielectric 50 (e.g., PEEK) by incorporating filler into dielectric 50. As shown in FIG. 7, for example, dielectric 50 may be provided with filler 74. Filler 74 may be, for example, particles or other structures formed from inorganic material or other material that is selected to adjust the coefficient of thermal expansion of dielectric 50 (e.g., without adversely affecting the dielectric constant and loss tangent properties of dielectric 50 at radio frequencies of interest). In the example of FIG. 8, flexible printed circuit has filler 74 formed from elongated fibers that run parallel to the length of flexible printed circuit 60. FIG. 9 shows how filler 74 may have first fibers that run parallel to the length of flexible printed circuit 60 and second fibers that run perpendicular to the length of the flexible printed circuit 60 (and perpendicular to the first fibers). The illustrative first and second perpendicular filler fibers of filler 74 of FIG. 10 are oriented at 45° to the length of flexible printed circuit 60. Fibers in filler 74 may be intertwined to form woven filler fabric or other suitable fabric. Other patterns of filler fibers and/or filler particles may be used in forming filler 74 for dielectric 50. The configurations of FIGS. 7, 8, 9, and 10 are illustrative. Filler 74 may include particles (e.g., nanoparticles), solid microspheres, hollow microspheres, flakes, rods, fibers, fabric with fibers, and/or filler structures of other types. In some configurations, dielectric 50 may be impregnated with bubbles (e.g., to adjust the dielectric constant of dielectric 50). Bubbles in dielectric 50 may be formed from air, nitrogen, or other gases. Droplets of liquid may also be included in dielectric 50, if desired. In some illustrative arrangements, dielectric 50 or parts of dielectric 50 is provided with solid filler such as particles, fibers, or other filler structures formed from ceramic, polymer, minerals such as talc (e.g., $H_2Mg_3(SiO_3)_4$ or $Mg_3Si_4O_{10}(OH)_2$), halloysite, or other minerals, alumina, silica, or other inorganic materials, graphene, and/or other filler material. The concentration of filler 74 in dielectric 50 may be 0% by weight, at least 1% by weight, at least 5% by weight, at least 10% by weight, at least 20% by weight, less than 50% by weight, less than 40% by weight, or other suitable concentration.

The incorporation of filler 74 may help adjust the coefficient of thermal expansion of dielectric 50. For example, filler 74 (e.g., mineral filler at 30% by weight or other suitable concentration) may be incorporated into dielectric 50 to help match the coefficient of thermal expansion of dielectric 50 to the material forming metal traces 62 (e.g., copper, which has a coefficient of thermal expansion of $18*10^{-6}$/T). In some configurations, the amount of filler 74 that is incorporated into dielectric 50 may be reduced (and, if desired, filler 74 can be omitted) to help avoid making dielectric 50 overly brittle. Multiple layers of dielectric 50 may also be laminated together to help create a printed circuit with desired coefficient of thermal expansion properties and satisfactory flexibility. As an example, flexible printed circuit 60 may contain one or more unfilled dielectric layers to enhance bendability and one or more filled layers to adjust the coefficient of thermal expansion.

Figure 11:
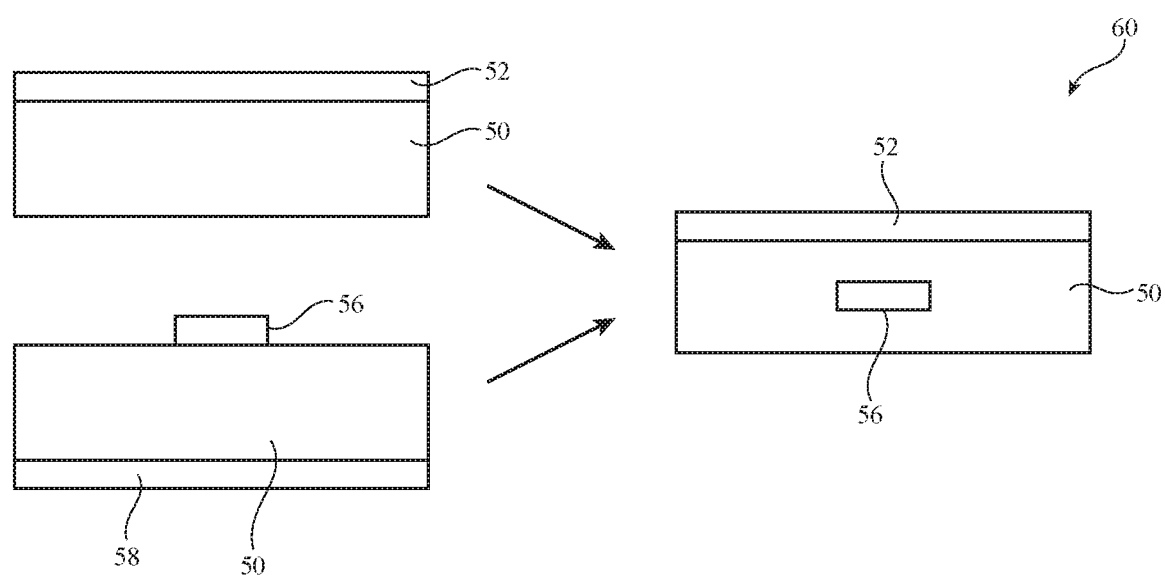
FIG. 11 is a diagram showing how two layers of dielectric may be thermally laminated without interposed bonding adhesive to produce a flexible printed circuit in accordance with an embodiment.

An illustrative lamination scheme is shown in FIG. 11. As shown in FIG. 11, multiple layers of dielectric 50 may be laminated to form printed circuit 60 without any intervening adhesive bonding layers. Metal traces such as illustrative metal traces 52 may be formed on a first layer of dielectric 50 and metal traces such as illustrative metal traces 56 and 58 may be formed on a second layer of dielectric 50. Metal traces may, as an example, be deposited using physical vapor deposition, electrochemical deposition, or other suitable deposition techniques and may be patterned using lift-off, photolithography, laser patterning, etc. After two or more flexible printed circuit layers are formed in this way, heat and pressure may be applied to join the thermoplastic dielectric material (dielectric 50) of the layers to form flexible printed circuit 60.

In the example of FIG. 11, the first and second layers of dielectric 50 are heated sufficiently to soften the PEEK material of these layers (e.g., a temperature of 280-320° C.) and allow these materials to bond to each other without using additional intervening adhesive. If desired, layers of dielectric 50 may be laminated using adhesive instead of or in addition to using heat and pressure to join layers of dielectric 50. Configurations in which adhesive bonding layers are omitted may be thinner than configurations that include adhesive bonding layers. The use of thin flexible printed circuits may help the flexible printed circuits bend without damage during manufacturing and during subsequent use in device 10 and may facilitate the use of the flexible printed circuits in devices in which space is at a premium.

Figure 12:
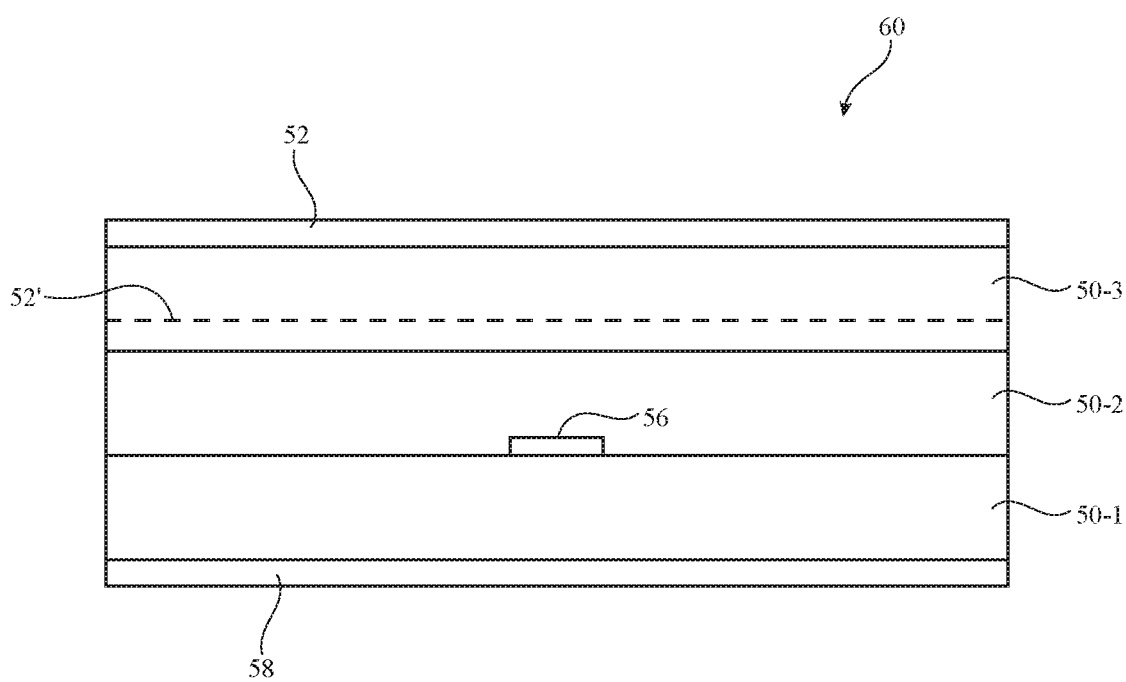
FIGS. 12 and 13 are cross-sectional side views of illustrative flexible printed circuits in accordance with embodiments.
Figure 13:
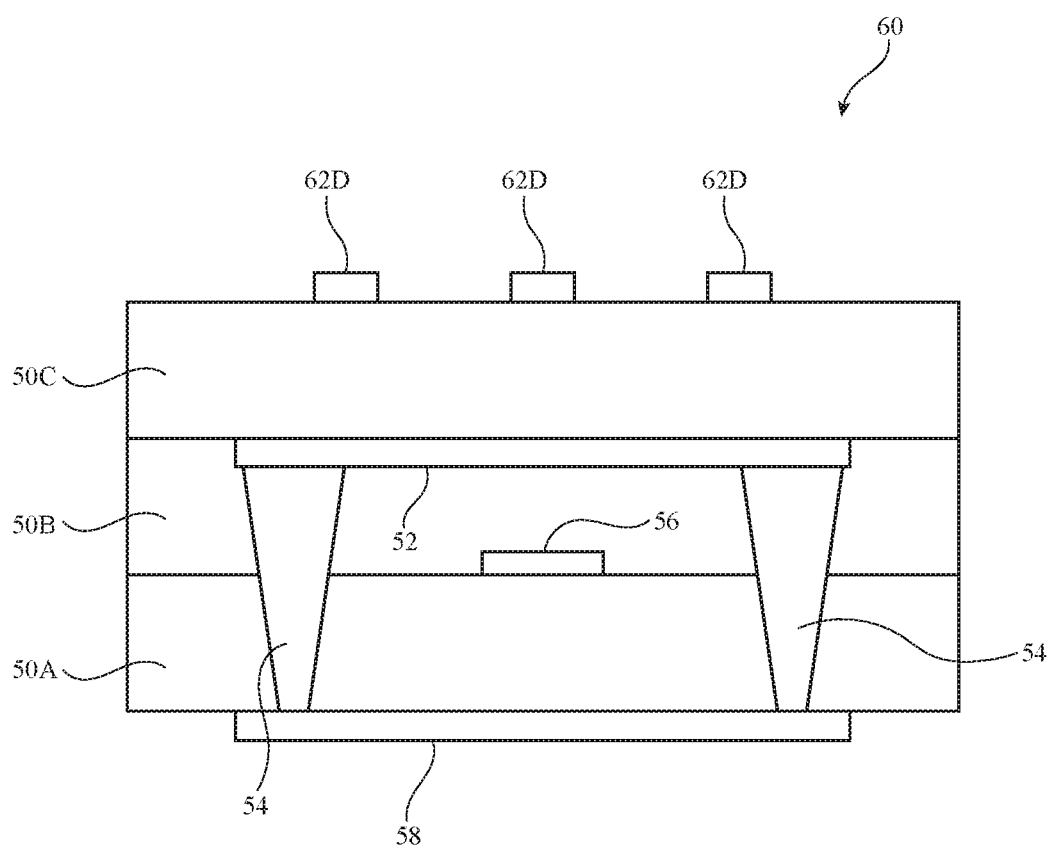

Flexible printed circuits 60 may include any suitable number of laminated sublayers and any suitable number of layers of metal traces (and any suitable via configuration). The metal traces may form radio-frequency circuitry such as antenna circuits. FIGS. 12 and 13 are cross-sectional side views of illustrative flexible printed circuits 60. Dielectric 50 of flexible printed circuits 60 may be PEEK dielectric and may be characterized by a dielectric constant (relative permeability) dk of 3.4 and a loss tangent df of 0.0045 at 2.4 GHz.

As shown in FIG. 12, flexible printed circuit 60 may include three layers (sublayers) of dielectric 50: dielectric layer 50-1, dielectric layer 50-2, and dielectric layer 50-3. Metal traces 52 may be formed on the upper surface of layer 50-3 or may be formed between layer 50-2 and layer 50-3 (e.g., to accommodate additional metal traces such as digital signal lines on the upper surface of layer 50-3). Metal traces 56 and 58 may be formed respectively on the upper and lower surfaces of layer 50-1 before laminating layers 50-1, 50-2, and 50-3 together (as an example). Vias may be used to electrically couple metal traces such as traces 52 and 58, if desired.

Unfilled PEEK has greater ductility than filled PEEK. To reduce brittleness in flexible printed circuit 60, one or more of the dielectric layers in printed circuit 60 may be formed from unfilled dielectric. At least one of the layers can be provided with filler 74 to help adjust the properties of flexible printed circuit 60 such as the coefficient of thermal expansion of printed circuit 60. The layer of dielectric that is provided with filler may be adjacent to metal traces in circuit 60 and/or may be separated from metal traces by an intervening layer of unfilled dielectric.

With one illustrative configuration, layer 50-1 may be an unfilled PEEK layer having a thickness of 4-16 microns or other suitable thickness, layer 50-2 may be a PEEK layer filled with filler 74 (e.g., linear glass strands, a woven fabric of glass strands, other filler fibers, filler particles, or other suitable filler 74) having a thickness of 4-16 microns or other suitable thickness, and layer 50-3 may be an optional additional unfilled PEEK layer having a thickness of 4-16 microns. Metal traces 52 may be formed on the upper surface of layer 50-3 or (as shown by traces 52') may be formed on the upper surface of layer 50-2. If desired, two or more, three or more, or four or more dielectric layers of other thickness (with or without filler) may be used in forming flexible printed circuit 60. Layers 50-1, 50-2, and/or 50-3 may be thermally laminated without using adhesive bonding layers and/or adhesive bonding layers may be interposed between these layers to facilitate lamination.

If desired, flexible printed circuit 60 may have a polymer coating. For example, an optional polymer coating may be applied over exposed metal traces such as metal traces 52 and 58 of FIG. 12. Vias may be provided to short metal trace layers together (see, e.g., vias 54 of FIG. 2). The metal traces of flexible printed circuit 60 of FIG. 12 may form a transmission line, other antenna circuitry, other radio-frequency circuitry, and/or other signal paths. In arrangements such as the illustrative arrangement of FIG. 12 that include multiple dielectric layers laminated together, one or more of the dielectric layers may be unfilled to enhance ductility and provide flexible printed circuit 60 with desired bendability (e.g., to accommodate a desired tight bend radius when flexible printed circuit 60 is mounted within the housing of electronic device 10), whereas one or more other dielectric layers may be provided with filler 74 to help match the coefficient of thermal expansion of those layers (and printed circuit 60) to the coefficient of thermal expansion of the metal used in forming metal traces such as metal traces 52, 56, and 58.

In the example of FIG. 13, flexible printed circuit 60 includes PEEK dielectric layers such as layers 50A, 50B, and 50C. Metal traces 62D may be formed on the upper surface of layer 50C to form signal lines (e.g., signal lines for carrying digital data signals, sometimes referred to as digital data lines). Metal traces 52 may be formed on the upper surface of layer 50B. Metal traces 56 and 58 may be formed, respectively, on the upper and lower surfaces of layer 50A. After metal traces have been formed on dielectric layers 50A, 50B, and/or 50C, layers 50A, 50B, and 50C may be laminated together (with or without using intervening adhesive bonding layers. To reduce brittleness in flexible printed circuit 60 of FIG. 13, one or more of the dielectric layers in printed circuit 60 of FIG. 13 may be formed from unfilled dielectric, while at least one of the dielectric layers in printed circuit 60 of FIG. 13 may be provide with filler 74 to help adjust the coefficient of thermal expansion of printed circuit 60. In an illustrative configuration, layer 50A may be an unfilled PEEK layer having a thickness of 4-16 microns or other suitable thickness, layer 50B may be an unfilled PEEK layer having a thickness of 4-16 microns or other suitable thickness, and layer 50C may a PEEK layer filled with filler 74 (e.g., linear glass strands, a woven fabric of glass strands, other filler fibers, filler particles, or other suitable filler 74) having a thickness of 4-16 microns or other suitable thickness.

The elongation-to-break value of unfilled PEEK is about three times larger than the elongation-to-break value of liquid crystal polymer, so the inclusion of unfilled PEEK in flexible printed circuit 60 may allow flexible printed circuit 60 to be formed with a reduced thickness while maintain a desired flexibility and strength. This allows flexible printed circuit 60 to be used in confined portions of device 10 where tight bend radiuses are used. The use of non-PEEK flexible printed circuits in device 10 that have locally thinned regions (e.g., regions with fewer layers than other regions to accommodate bending) may, if desired, be reduced or eliminated by using PEEK flexible printed circuits. For example, flexible printed circuit 60 in device 10 may be a five-layer PEEK flexible printed circuit that accommodates a desired tight bend radius whereas a non-PEEK five-layer flexible printed circuit might use local thinning (e.g., to three layers) in a portion of the printed circuit overlapping a tight bend radius region.

In addition to or instead of using multiple layers of dielectric 50 with different amounts of filler 74, flexible printed circuit dielectric in one or more layers of flexible printed circuit 60 may be provided with different properties along the length of flexible printed circuit 60. As an example, flexible printed circuit 60 may be constructed from dielectric that has one or more regions along its length where the bendability of the flexible printed circuit is locally enhanced. These enhanced-bendability regions may be used to form tight bend radiuses, whereas other portions of the flexible printed circuit may be configured to have other desirable properties (e.g., a coefficient of thermal expansion matched to that of copper in traces 62).

Figure 14:
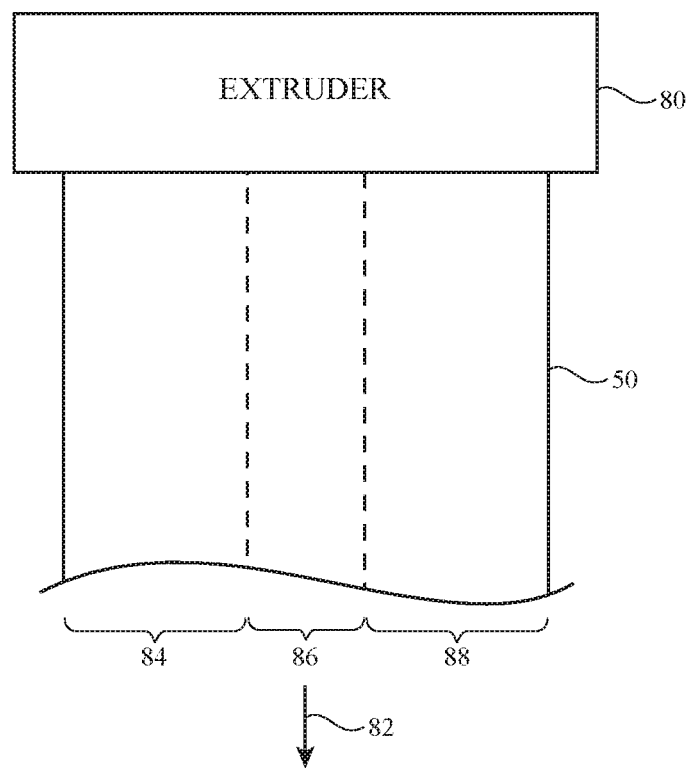
FIG. 14 is a diagram showing how flexible printed circuit layers can be formed with different material properties in different portions in accordance with an embodiment.

Illustrative equipment for forming a flexible printed circuit dielectric layer with properties that vary across the layer (laterally across a planar layer) is shown in FIG. 14. As shown in FIG. 14, dielectric layer formation equipment such as extrusion tool 80 may be used to produce a sheet of dielectric 50 (e.g., PEEK). Different portions across the width of the sheet may be provided with different properties (e.g., different thicknesses, different concentrations of filler 74, and/or other locally adjusted attributes). After forming one or more layers of dielectric 50 with properties that vary across the dielectric, these layers can be cut across their widths (e.g., in strips or other suitable shapes) and laminated together to form a flexible printed circuit with ductility and/or other properties that vary across the flexible printed circuit. For example, one or more layers of dielectric 50 in flexible printed circuit 60 may have a ductility that varies along the length of flexible printed circuit 60.

As an example, left-hand portion 84 of dielectric 50 of FIG. 14 and right-hand portion 88 of dielectric 50 of FIG. 14 may have a first thickness and central portion 86 of dielectric 50 of FIG. 14 may have a second thickness. The second thickness may be, for example, thinner than the first thickness to enhance the bendability of a flexible printed circuit in region 86. As another example, left-hand portion 84 and right-hand portion 88 may include filler 74 (e.g., 30% mineral filler) to match the coefficient of thermal expansion of dielectric 50 to that of copper. Central portion 86 in this type of arrangement may have less filler than portions 84 and 88 (e.g., a reduced amount of filler or no filler) to enhance the ductility of region 86. Both of these approaches and/or other approaches may be used simultaneously if desired. After forming one or more layers of dielectric 50 in this way, the layers can be laminated to form a printed circuit such as flexible printed circuit 60 of FIG. 15 that has properties that vary across the surface of the flexible printed circuit.

Figure 15:
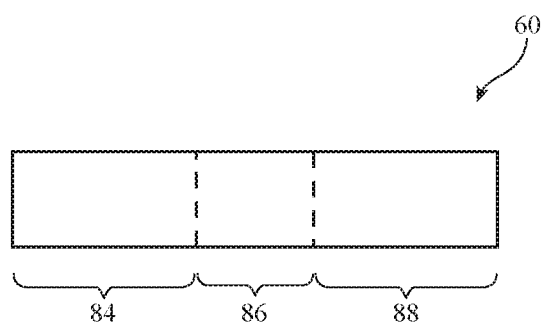
FIG. 15 is a diagram of an illustrative flexible printed circuit formed using equipment of the type shown in FIG. 14 in accordance with an embodiment.

As an example, flexible printed circuit 60 of FIG. 15 may have a first coefficient of thermal expansion and a first ductility value in regions 84 and 88 and may have a second coefficient of thermal expansion that is different (e.g., greater than) the first coefficient of thermal expansion and a second ductility value that is different (e.g., greater than) the first coefficient of expansion. Metal traces that run along the length of flexible printed circuit 60 will experience a good coefficient-of-thermal expansion match with the dielectric of flexible printed circuit 60 in regions 84 and 88. In region 86, flexible printed circuit 60 will have an enhanced bendability that may help flexible printed circuit 60 bend with a tight bend radius.

The foregoing is merely illustrative and various modifications can be made to the described embodiments. The foregoing embodiments may be implemented individually or in any combination.

What is claimed is:

1. A radio-frequency flexible printed circuit, comprising:
   metal traces configured to form at least one radio-frequency transmission line, wherein the at least one radio-frequency transmission line includes first and second radio-frequency transmission line paths and the first radio-frequency transmission line path includes first and second portions; and
   a multilayer substrate formed from polyether ether ketone that is configured to support the metal traces, wherein the multilayer substrate has a first layer of polyether ether ketone laminated to a second layer of polyether ether ketone without any intervening adhesive bonding layers and a third layer of polyether ether ketone laminated to the second layer of polyether ether ketone without any intervening adhesive bonding layers, one of the metal traces is at least partly interposed between the first and third layers, the first and second layers are interposed between the first and second portions of the first radio-frequency transmission line path, and the second radio-frequency transmission line path is interposed between the first and second layers.

2. The radio-frequency flexible printed circuit defined in claim 1 wherein the first layer comprises unfilled polyether ether ketone.

3. The radio-frequency flexible printed circuit defined in claim 2 wherein the polyether ether ketone of the second layer includes filler.

4. The radio-frequency flexible printed circuit defined in claim 3 wherein the filler comprises mineral filler.

5. The radio-frequency flexible printed circuit defined in claim 4 wherein the mineral filler comprises talc.

6. The radio-frequency flexible printed circuit defined in claim 3 wherein the filler comprises fiber filler.

7. The radio-frequency flexible printed circuit defined in claim 6 wherein the fiber filler comprises woven fiber filler having woven glass fibers.

8. The radio-frequency flexible printed circuit defined in claim 7 wherein at least some of the metal traces are formed between the first and second layers.

9. The radio-frequency flexible printed circuit defined in claim 8 wherein the third layer is unfilled.

10. The radio-frequency flexible printed circuit defined in claim 3 wherein the metal traces comprise copper traces and wherein the copper traces and the second layer of polyether ether ketone that includes the filler have first and second respective coefficients of thermal expansion that are matched within 20%.

11. The radio-frequency flexible printed circuit defined in claim 10 wherein the metal traces are configured to form an antenna coupled to the transmission line.

12. The radio-frequency flexible printed circuit defined in claim 1 wherein the first layer comprises unfilled polyether ether ketone and is characterized by a first ductility value and a first coefficient of thermal expansion and the second layer is characterized by a second ductility value that is less than the first ductility value and a second coefficient of thermal expansion that is less than the first coefficient of thermal expansion.

13. The radio-frequency flexible printed circuit defined in claim 3 wherein the filler reduces a coefficient of thermal expansion of the first layer.

14. The radio-frequency flexible printed circuit defined in claim 1, wherein the multilayer substrate has a length and the multilayer substrate includes a filler including fibers that extend parallel to the length.

* * * * *